United States Patent [19]
Goto

[11] Patent Number: 5,739,578
[45] Date of Patent: Apr. 14, 1998

[54] HIGH POWER TRANSISTOR WITH CONTACT PLUGS EXTENDED FROM COLLECTORS THROUGH A SUBSTRATE TO HAVE ENDS CONNECTED TOGETHER IN AN INDENT IN THE SUBSTRATE

[75] Inventor: Norio Goto, Tokyo, Japan

[73] Assignee: NEC Corporation, Tokyo, Japan

[21] Appl. No.: 800,376

[22] Filed: Feb. 14, 1997

[30] Foreign Application Priority Data

Feb. 15, 1996 [JP] Japan .................................. 8-028257

[51] Int. Cl.$^6$ ...................... H01L 27/082; H01L 27/102; H01L 29/70
[52] U.S. Cl. ........................... 257/578; 257/584; 257/586
[58] Field of Search ........................... 257/197, 198, 257/586, 578

[56] References Cited

U.S. PATENT DOCUMENTS 5,332,912  7/1994  Nozu et al. ................. 257/197
5,485,025  1/1996  Chau et al. ................. 257/197

FOREIGN PATENT DOCUMENTS 61-89665   5/1986  Japan .
2-194532   8/1990  Japan .

*Primary Examiner*—Wael Fahmy
*Attorney, Agent, or Firm*—Foley & Lardner

[57] ABSTRACT

A high power bipolar transistor comprises stacks of emitter, base, and collector regions and an emitter and a base connection on an obverse surface of a semiconductor substrate, and a via-hole member through the substrate between a selected one of the emitter and the base connections. A ground connection is formed on a reverse surface of the substrate. A high power bipolar transistor comprises a collector connection on a bottom surface of a semiconductor sheet having a level different from the reverse surface and a plurality of contact plugs formed through the semiconductor sheet between the collector connection and the collector regions, respectively. Preferably, the contact plugs are formed simultaneously with the via-hole member.

4 Claims, 4 Drawing Sheets

5,739,578

HIGH POWER TRANSISTOR WITH CONTACT PLUGS EXTENDED FROM COLLECTORS THROUGH A SUBSTRATE TO HAVE ENDS CONNECTED TOGETHER IN AN INDENT IN THE SUBSTRATE

BACKGROUND OF THE INVENTION

This invention relates to a high power bipolar transistor comprising a plurality of small power bipolar transistor fingers on a semiconductor substrate.

In the manner that will later be exemplified, each transistor finger comprises a stack of an emitter, a base, and a collector electrode or region. Either the emitter or the base electrode is grounded. The emitter or the base electrode will herein be called a selected electrode. In order to ground the selected electrodes of the transistor fingers, it is convenient to use a via-hole member. This via-hole technique is effective in reducing a grounding impedance and in putting the high power bipolar transistor into operation in a high frequency range.

Even if the via-hole technique is resorted to, it is inevitable for the connections of electrodes of the transistor fingers to cross each other on a surface of the substrate. Moreover, most of heat is generated at each collector electrode during operation of the high power bipolar transistor. Inasmuch as the collector electrodes are not grounded, the via-hole technique is insufficient to dissipate the heat.

On the other hand, an improved bipolar transistor is disclosed in each of Japanese Patent Prepublications (A) Nos. 89,665 of 1986 and 194,532 of 1990. The improved bipolar transistor comprises a collector electrode as a buried region. A collector connection is placed on a surface of the substrate and is connected to the collector electrode by a conductor mass filled in a hole formed in the substrate from the surface to the collector electrode.

SUMMARY OF THE INVENTION

In view of the foregoing, it is an object of the present invention to provide a high power bipolar transistor that comprises a plurality of low power bipolar transistor fingers on an obverse surface of a semiconductor substrate, each finger comprising an emitter, a base, and a collector electrode with one of the emitter and the base electrode selected as a selected electrode, and having a low grounding impedance between the selected electrode and ground.

It is another object of this invention to provide a high power bipolar transistor comprising an emitter connection for the emitter electrodes of the transistor fingers and a base connection for the base electrodes of the transistor fingers on the obverse surface, and a collector connection for the collector electrodes of the transistor fingers with crossovers of the collector connection obviated relative to the emitter and the base connections.

It is still another object of this invention to provide a high power bipolar transistor not having a ground connection on the obverse surface.

It is yet another object of this invention to provide a high power bipolar transistor in which the collector connection has no capacitive coupling between the emitter and the base connections. Thus, no damage is caused to the high power bipolar transistor as regards its high frequency characteristics.

It is a further object of this invention to provide a high power bipolar transistor in which heat dissipation is excellent as regards to the collector electrodes.

Other objects of this invention will become clear as the description proceeds.

In accordance with this invention, there is provided a high power bipolar transistor comprising a semiconductor substrate having obverse and reverse surfaces, a plurality of bipolar transistor fingers on the obverse surface, and a ground connection on the reverse surface. Each transistor finger comprises an emitter electrode, a base electrode, and a collector electrode, and which further comprises an emitter connection and a base connection connected, respectively, to the emitter electrodes and the base electrodes of the transistor fingers with one of the emitter and the base connections (hereafeter a selected connection) and a via-hole member through the semiconductor substrate between the selected connection and the ground connection. According to the invention, an indent is formed in the semiconductor substrate from the reverse surface to have a bottom surface adjacent to the collector electrodes of the transistor fingers and to leave a substrate sheet between the obverse and the bottom surfaces, the high power bipolar transistor comprising a plurality of contact plugs through the substrate sheet to reach the collector electrodes, respectively, and a collector connection connecting the contact plugs along the bottom surface.

DESCRIPTION OF THE PREFERRED EMBODIMENTS

Figure 1:
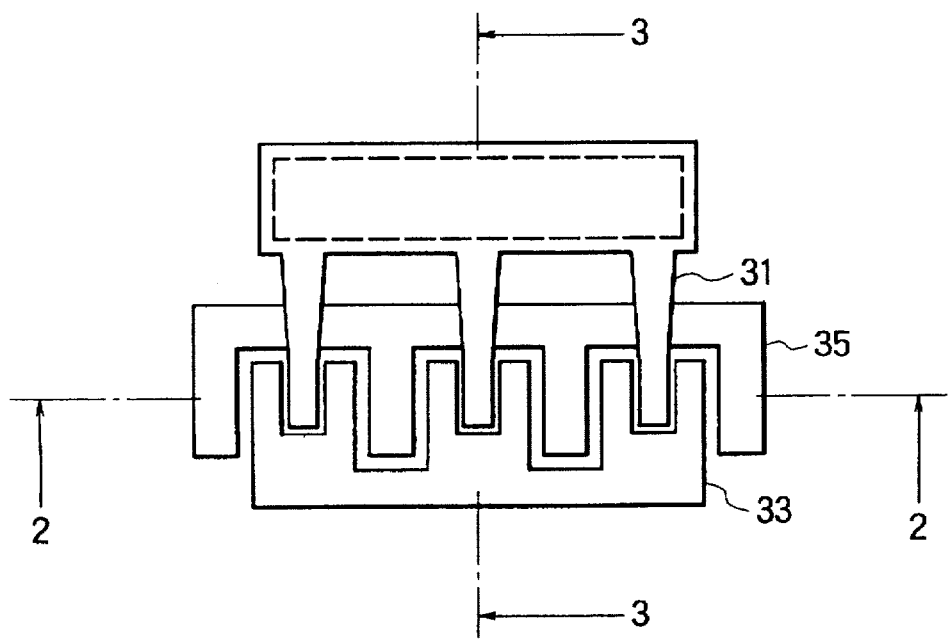
FIG. 1 is a top view of a conventional high power bipolar transistor.
Figure 2:
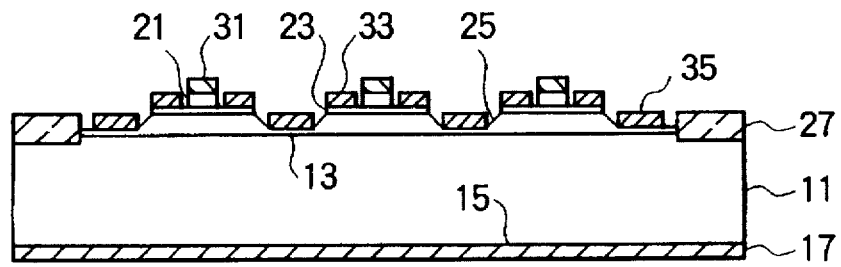
FIG. 2 is a schematic vertical sectional view taken along line 2—2 of FIG. 1.
Figure 3:
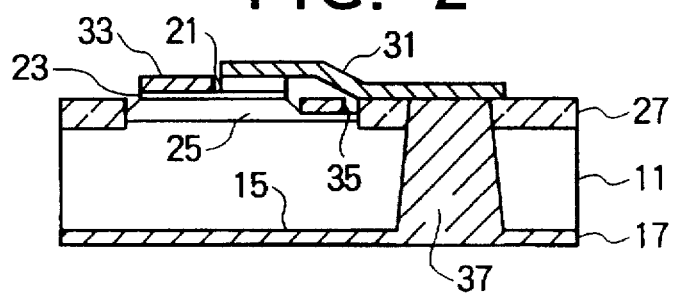
FIG. 3 is a schematic vertical sectional view taken along line 3—3 of FIG. 1.

Referring to FIGS. 1 to 3, a conventional high power bipolar transistor will first be described in order to facilitate an understanding of the present invention. The conventional high power bipolar transistor comprises a plurality of bipolar transistor fingers and has a structure according to a via-hole technique.

In FIGS. 1 to 3, the bipolar transistor comprises galium arsenide (GaAs) semiconductor substrate 11, which has an obverse or front surface 13 and a reverse or rear surface 15. The bipolar transistor fingers are arranged parallel on or along the obverse surface 13. A ground connection 17 is formed on the reverse surface 15.

Each transistor finger comprises a stack of an n-doped region for use as an emitter electrode or region 21, a p-doped region for use as a base electrode or region 23, and another n-doped region for use as a collector electrode or region 25. Consequently, the high power bipolar transistor comprises on or along the obverse surface 13, a plurality of stacks of emitter electrodes 21, base electrodes 23, and collector electrodes 25. In the manner clearly depicted in FIG. 2, the collector electrodes 25 cover the obverse surface as an integral collector layer, which is indicated by the reference numeral 25.

Although not depicted in FIG. 1 merely for simplicity of illustration, an isolation region 27 is formed surrounding the emitter, the base, and the collector electrodes 21, 23, and 25 by injecting isolator ions into a surface layer of the semiconductor substrate 11 from the obverse surface 13. See FIG. 2. In FIG. 1, the semiconductor substrate 11 or its obverse surface 13 is not depicted for convenience of illustration.

The high power bipolar transistor further comprises, on the obverse surface 13, an emitter connection 31 connecting the emitter electrodes 21 together and extending outwardly of the transistor fingers, and a base connection 33 connecting the base electrodes 23 together and outwardly extending in an opposite direction relative to the emitter connection 31.

The collector electrodes 25 are connected together by a collector connection 35 placed in a shallow indent formed into the collector electrode layer 25. Although electric contact is obviated, the collector connection 35 inevitably crosses the selected connection, which is in FIGS. 1 to 3 the emitter connection 31.

In the manner already known, a via-hole is formed through the semiconductor substrate 11 and the isolation layer 27 to reach the obverse surface 13 and filled with a mass of conductor, such as gold, for use as a via-hole member 37 connecting the emitter connection 31 to the ground electrode 17. Preferably, the ground connection 17 is formed together with the via-hole member 37. Alternatively, the ground connection 17 is formed after completion of the via-hole member 37 to be integral with the via-hole member 37.

Figure 4:
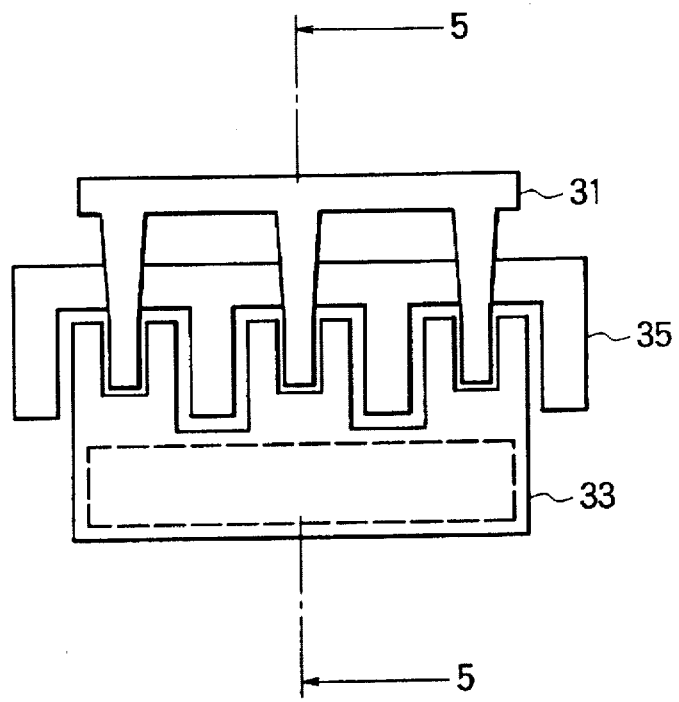
FIG. 4 is a top view of another conventional high power bipolar transistor.
Figure 5:
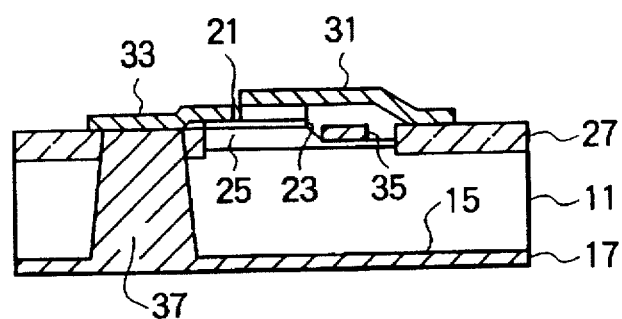
FIG. 5 schematically shows a vertical section taken along line 5—5 of FIG. 4.

Turning to FIGS. 4 and 5, another conventional high power bipolar transistor will be described in order to further facilitate the understanding of this invention. Throughout the following, similar parts will be designated by like reference numerals.

In connection with this conventional high power bipolar transistor, a vertical section is not different from FIG. 2 when taken along a line that is similar to line 2—2 of FIG. 1. In FIGS. 4 and 5, it will be seen that the base connection 33 is much extended as the selected connection outwardly relative to the transistor fingers in the direction opposite to the emitter connection 31. This is in order to form the via-hole member 37 through the semiconductor substrate 11 between the ground connection 17 and the selected connection, which is here the base connection 33.

Figure 6:
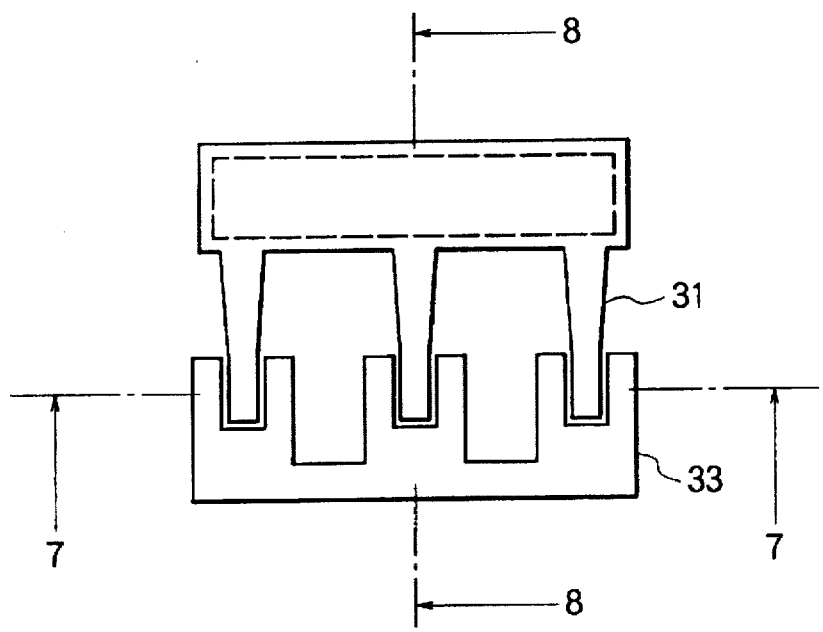
FIG. 6 is a top view of a high power bipolar transistor according to a first embodiment of the instant invention.
Figure 7:
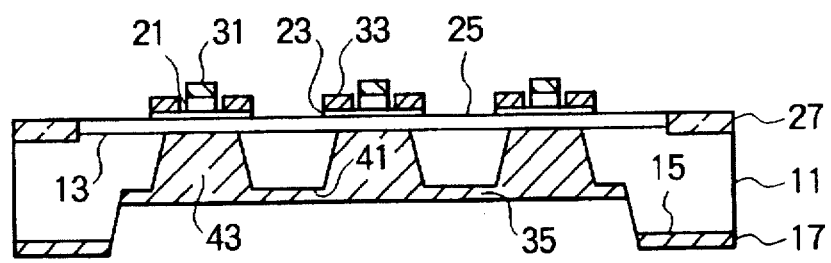
FIG. 7 is a schematic vertical sectional view taken along line 7—7 of FIG. 6.
Figure 8:
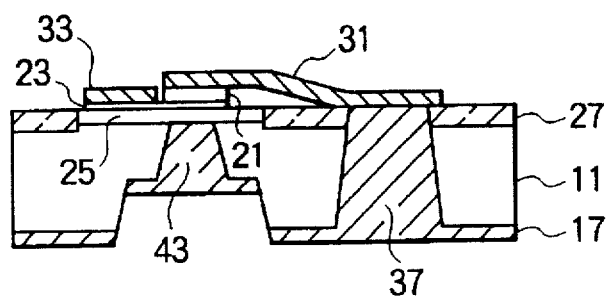
FIG. 8 is a schematic vertical sectional view taken along line 8—8 of FIG. 6.

Referring now to FIGS. 6 to 8, the description will proceed to a high power bipolar transistor according to a first preferred embodiment of this invention. This high power bipolar transistor corresponds to the conventional high power bipolar transistor illustrated with reference to FIGS. 1 to 3.

As is clear from FIGS. 7 and 8, it is unnecessary in connection with the high power bipolar transistor according to this invention for the collector layer 25 to indispensably include the shallow indent described in conjunction with FIG. 2. This reduces the cost of manufacturing the bipolar transistor.

Into the semiconductor substrate 11, an indent is formed from the reverse surface 15 as by etching. The indent has a bottom surface 41 that is only partly depicted in FIGS. 7 and 8. The bottom surface 41 is approximately on a plane that bisects a whole substrate thickness of the semiconductor substrate 11. In other words, the indent leaves a substrate sheet between the obverse surface 13 and the bottom surface 41. The semiconductor sheet has a sheet thickness equal to about a half of the substrate thickness.

In addition, a plurality of contact holes are formed through the substrate sheet. The contact holes extend from the bottom surface 41 to the respective collector electrodes 25. It is possible to form the indent and the contact holes as by etching concurrently with formation of the via-hole for the via-hole member 37.

For use as contact plugs 43, masses of conductor, such as gold, are filled in the contact holes. The collector connection 35 is formed along the bottom surface 41 to connect the contact plugs at their ends, which are substantially flush with the bottom surface 41. It is possible to fill the conductor masses in the contact holes and to form the collector connection 35 simultaneously with formation of the via-hole member 37.

Figure 9:
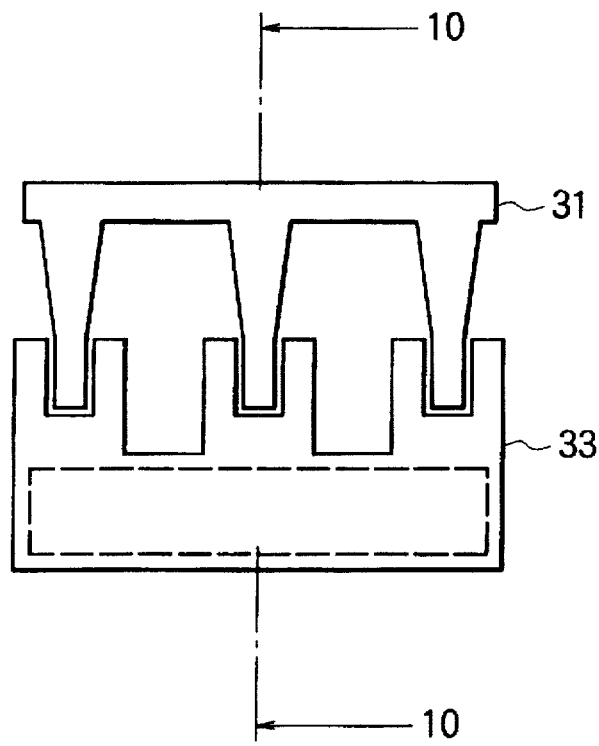
FIG. 9 is a top view of a high power bipolar transistor according to a second embodiment of this invention.
Figure 10:
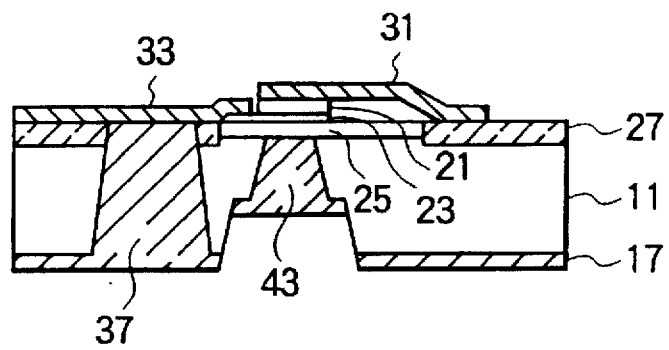
FIG. 10 schematically shows a vertical section taken along line 10—10 of FIG. 9.

Turning to FIGS. 9 and 10, attention will be directed to a high power bipolar transistor according to a second preferred embodiment of this invention. This high power bipolar transistor corresponds to the conventional one illustrated with reference to FIGS. 4 and 5.

Instead of the emitter connection 31, the base connection 33 is grounded as the selected connection by the via-hole member 37 to the ground connection 17. In other respects, the high power bipolar transistor of FIGS. 9 and 10 is similar to that described with reference to FIGS. 6 to 8.

Reviewing FIGS. 6 to 10, it should be noted that the collector connection 35 is formed on a level that is different from the ground connection 17. This is because the ground connection 17 is usually soldered to a metal block (not shown) with such a high power bipolar transistor used with the emitter electrodes or regions 21 disposed atop (emitter top). The contact plugs 43 are effective in improving a dissipation capacity for the collector electrodes or the collector layer 25. Although FIGS. 6 and 9 are drawn like FIGS. 1 and 3 with the emitter connection 31 widely spaced from the base connection 33, it is possible to arrange the emitter and the base connections 31 and 33 closer to make the bipolar transistor occupy a narrower area on a semiconductor chip.

While this invention has thus far been described in conjunction with only two preferred embodiments thereof, it will be readily possible for one skilled in the art to carry this invention into effect in various other manners. For example, the semiconductor substrate 11 may be made of other semiconductor material.

What is claimed is:

1. A high power bipolar transistor comprising:

a semiconductor substrate having an obverse surface and a reverse surface;

a plurality of bipolar transistor fingers on said obverse surface and a ground connection on said reverse surface, each transistor finger including an emitter electrode, a base electrode, and a collector electrode;

an emitter connection and a base connection connected, respectively, to the emitter electrodes and the base electrodes of said transistor fingers;

a via-hole member extending through said semiconductor substrate between said ground connection and one of said emitter and said base connections;

an indent formed in said semiconductor substrate from said reverse surface, said indent forming a bottom surface adjacent to the collector electrodes of said transistor fingers and leaving a substrate layer between said obverse and said bottom surface;

a plurality of contact plugs extending through said substrate layer to said collector electrodes, respectively; and a collector connection connecting said contact plugs along said bottom surface.

2. A high power bipolar transistor as claimed in claim 1, wherein said one connection is said emitter connection.

3. A high power bipolar transistor as claimed in claim 1, wherein said one connection is said base connection.

4. A high power bipolar transistor comprising:

a semiconductor substrate having an obverse surface and a reverse surface;

a plurality of bipolar transistor fingers on the obverse surface and a ground connection on the reverse surface, each transistor finger including an emitter electrode, a base electrode, and a collector electrode;

an emitter connection and a base connection connected, respectively, to the emitter electrodes and the base electrodes of the transistor fingers;

a via-hole member extending through the semiconductor substrate between the ground connection and one of the emitter and the base connections;

an indent formed in the semiconductor substrate from the reverse surface, the indent forming a bottom surface adjacent to the collector electrodes of the transistor fingers and leaving a substrate layer between the obverse and the bottom surface;

a plurality of contact plugs extending through the substrate layer to the collector electrodes, respectively; and a collector connection connecting the contact plugs along said bottom surface, wherein the substrate layer is about a half as thick as the semiconductor substrate.

* * * * *